(12) United States Patent
Akamine et al.

(10) Patent No.: US 7,984,406 B2
(45) Date of Patent: Jul. 19, 2011

(54) TIMING VERIFICATION METHOD AND APPARATUS

(75) Inventors: Takeichirou Akamine, Kasugai (JP);
Toshikatsu Hosono, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 665 days.

(21) Appl. No.: 12/010,202

(22) Filed: Jan. 22, 2008

(65) Prior Publication Data

US 2008/0178134 A1 Jul. 24, 2008

(30) Foreign Application Priority Data

Jan. 19, 2007 (JP) ................................ 2007-010361

(51) Int. Cl.
*G06F 17/50* (2006.01)
(52) U.S. Cl. .................... 716/115; 716/108; 716/113
(58) Field of Classification Search .................. None
See application file for complete search history.

(56) References Cited

U.S. PATENT DOCUMENTS

| | | | |
|---|---|---|---|
| 6,507,936 B2 | 1/2003 | Yamaguchi | |
| 6,880,142 B2 * | 4/2005 | Cui et al. | 716/6 |
| 7,197,728 B2 * | 3/2007 | Yonezawa | 716/4 |
| 7,346,874 B1 * | 3/2008 | Burks | 716/6 |
| 7,475,377 B2 * | 1/2009 | Yamada | 716/12 |
| 7,673,260 B2 * | 3/2010 | Chen et al. | 716/4 |
| 7,684,969 B2 * | 3/2010 | Habitz et al. | 703/14 |
| 7,802,218 B2 * | 9/2010 | Inoue et al. | 716/10 |
| 2004/0216067 A1 | 10/2004 | Tanaka et al. | |

FOREIGN PATENT DOCUMENTS

| | | |
|---|---|---|
| JP | 2001-306647 | 11/2001 |
| JP | 2004-326654 A | 11/2004 |
| JP | 2004-362202 | 12/2004 |
| JP | 2006-209702 A | 8/2006 |
| JP | 2006-278613 | 10/2006 |

OTHER PUBLICATIONS

Japanese Office Action, Partial English-language translation, mailed May 10, 2011 for Japanese Application No. 2007-010361.

* cited by examiner

*Primary Examiner* — Leigh Marie Garbowski
(74) *Attorney, Agent, or Firm* — Fujitsu Patent Center

(57) ABSTRACT

A computer-implemented timing verification method for obtaining delay time for a signal propagated through a signal path and performing timing verification. The method stores a table including a wiring resistance variation amount and a wiring capacitance variation amount that are in accordance with a geometry deviation of a wire from a reference geometry, extracts a wiring structure of the signal path from a storage unit, extracts a wiring resistance variation amount and a wiring capacitance variation amount that correspond to the extracted wiring structure from the table, generates an on-chip-variation coefficient from the extracted wiring resistance variation amount and wiring capacitance variation amount, and calculates delay time for the signal propagated through the signal path based on the generated on-chip-variation coefficient.

7 Claims, 5 Drawing Sheets

| | | Low ←——→ High | | |
|---|---|---|---|---|
| | | Wiring Density of Same Layer | | |
| | | Dd1 | ... | Ddm |
| Low ↑ Wiring Density of Lower Layer ↓ High | Du1 | $\sigma_{R\_11}$ | ... | $\sigma_{R\_m1}$ |
| | | ... | ⋱ | ... |
| | Dun | $\sigma_{R\_1n}$ | ... | $\sigma_{R\_mn}$ |

~33a

| | | Low ←——→ High | | |
|---|---|---|---|---|
| | | Wiring Density of Same Layer | | |
| | | Ds1 | ... | Dsm |
| Low ↑ Wiring Density of Lower Layer ↓ High | Du1 | $\sigma_{C\_11}$ | ... | $\sigma_{C\_m1}$ |
| | | ... | ⋱ | ... |
| | Dun | $\sigma_{C\_1n}$ | ... | $\sigma_{C\_mn}$ |

~33b

Fig. 7
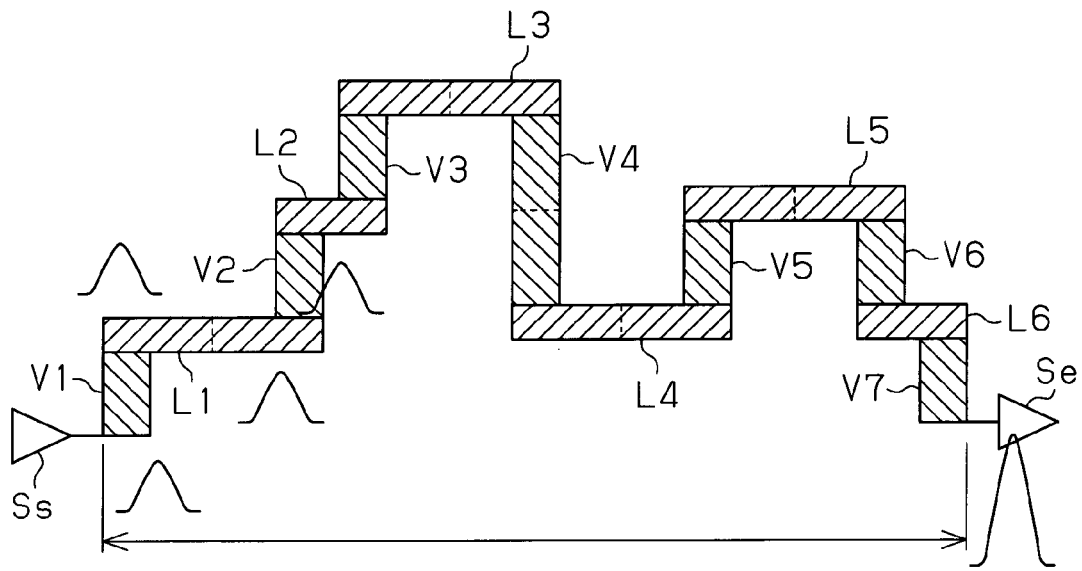
Fig. 8 (a)
Fig. 8 (b)
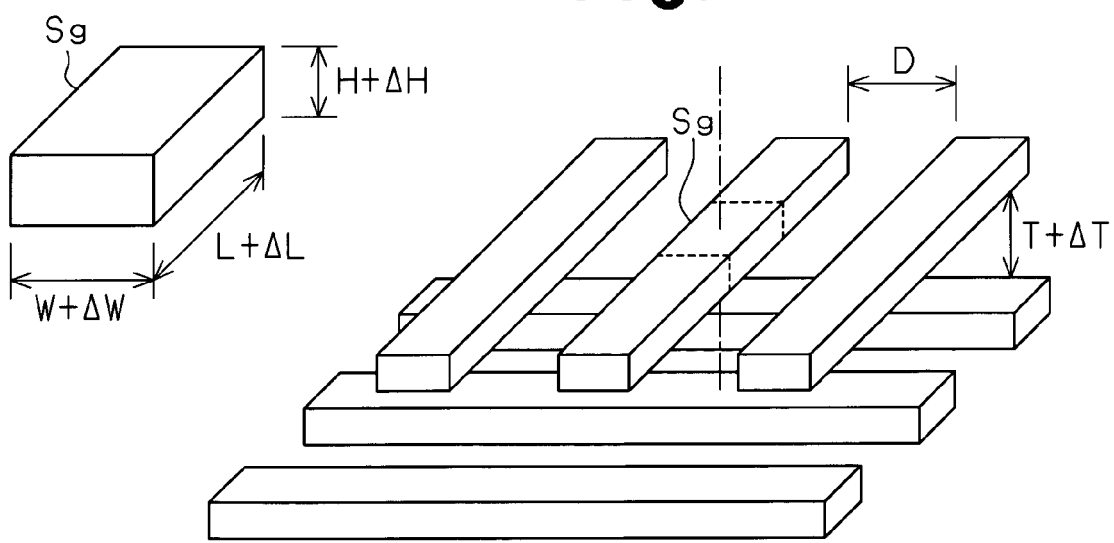

Fig.9(a)

| | | Wiring Density of Same Layer | | | |
|---|---|---|---|---|---|
| | | Low ←——→ High | | | |
| | | Dd1 | ... | Ddm | |
| Wiring Density of Lower Layer (Low ↕ High) | Du1 | $\sigma_{R\_11}$ | ... | $\sigma_{R\_m1}$ | ~33a |
| | ... | ... | ⋱ | ... | |
| | Dun | $\sigma_{R\_1n}$ | ... | $\sigma_{R\_mn}$ | |

Fig.9(b)

| | | Wiring Density of Same Layer | | | |
|---|---|---|---|---|---|
| | | Low ←——→ High | | | |
| | | Ds1 | ... | Dsm | |
| Wiring Density of Lower Layer (Low ↕ High) | Du1 | $\sigma_{C\_11}$ | ... | $\sigma_{C\_m1}$ | ~33b |
| | ... | ... | ⋱ | ... | |
| | Dun | $\sigma_{C\_1n}$ | ... | $\sigma_{C\_mn}$ | |

Fig.10(a)

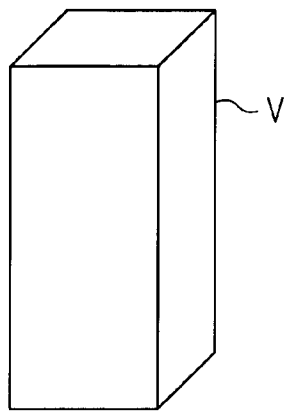
V

Fig.10(b)

| Via Location | Via Resistance Variation | |
|---|---|---|
| M1-M2 | $\sigma_{VIAR12}$ | ~33c |
| M2-M3 | $\sigma_{VIAR23}$ | |
| M3-M4 | $\sigma_{VIAR34}$ | |
| M4-M5 | $\sigma_{VIAR45}$ | |
| M5-M6 | $\sigma_{VIAR56}$ | |
| M6-M7 | $\sigma_{VIAR67}$ | |

TIMING VERIFICATION METHOD AND APPARATUS

CROSS-REFERENCE TO RELATED APPLICATIONS

This application is based upon and claims the benefit of priority from the prior Japanese Patent Application No. 2007-010361, filed on Jan. 19, 2007, the entire contents of which are incorporated herein by reference.

FIELD

This application relates to a timing verification method and a timing verification apparatus.

DESCRIPTION OF THE RELATED ART

The development of a semiconductor integrated circuit includes a verification process, in which the delay of a logic circuit is calculated to verify operation timings and delays. The verification process extracts the cross-sectional structure of a semiconductor integrated circuit device (LSI) and performs timing verification on the LSI circuit. The verification takes into consideration variations in the delay time and characteristic values of the LSI circuit that are caused by wiring characteristics including wiring resistance and wiring capacitance. The progress in LSI technology and miniaturization of LSIs has resulted in a tendency for the wiring resistance and wiring capacitance of an LSI circuit to increase. This significantly affects the delay time and characteristic values. Therefore, proper recognition of the wiring resistance and the wiring capacitance is crucial for accurate timing verification.

BACKGROUND ART

The designing of a semiconductor integrated circuit device (LSI) includes timing verification to verify and ensure the operation of a logic circuit. In the timing verification, information on the wiring length, wiring width, and wiring interval is extracted from pattern data of an LSI, the layout of which has been designed. Then, a timing analysis is conducted on the LSI circuit taking into consideration the delay time and characteristics of the LSI circuit that are caused by the wiring resistance and the wiring capacitance (refer to Japanese Laid-Open Patent Publication Nos. 2001-306647, 2004-362202, and 2006-278613). Based on the timing analysis results, the appropriateness of the LSI circuit is determined and corrections are made to the circuit when necessary.

SUMMARY

The timing verification process of the prior art uses values of factors (wiring resistance and wiring capacitance) that maximize the delay value as well as values of factors (wiring resistance and wiring capacitance) that minimize the delay value. More specifically, the prior art timing verification process simultaneously uses a maximum resistance value (Rmax) and a maximum capacitance value (Cmax) as the condition that maximizes the delay value. Further, the prior art timing verification process simultaneously uses a minimum resistance value (Rmin) and a minimum capacitance value (Cmin) as the condition that minimizes the delay value.

However, the above combinations of the two minimum values or the two maximum values used to calculate the delay value would never occur in an actual circuit. This will be described using two adjacent parallel wires as an example.

The value of the wiring resistance increases as the cross-sectional area of each wire decreases. The interval between the two wires increases as the cross-sectional area of each wire decreases. The value of the capacitance of each wire decreases as the interval between the two wires increases. In contrast, the value of the resistance of each wire decreases as the cross-sectional area of each wire increases. The interval between the two wires decreases as the cross-sectional area of each wire increases. The value of the capacitance of each wire increases as the interval between the two wires decreases. In this manner, in the prior art timing verification process, the delay value is calculated using the combination of the maximum resistance value (Rmax) and the maximum capacitance value (Cmax) or the combination of the minimum resistance value (Rmin) and the minimum capacitance value (Cmin). This conventional calculation is equivalent to calculating the delay value based on unrealistic wiring geometries. When such calculation is performed, variations in the calculated delay value may be far greater than variations in an actual delay value.

Causes of variations in the wiring resistance and the wiring capacitance include the structure of an LSI chip, that is, the cross-sectional shape and density of wires of the LSI chip. The values of the wiring resistance and the wiring capacitance may vary between different regions on the LSI chip. However, as a value representing delay value affecting factors, such as the wiring resistance and the wiring capacitance, the prior art method uses only a single on-chip-variation (OCV) coefficient for the entire LSI chip.

As described above, timing verification is performed under pessimistic conditions having excessive margins to guarantee timings. Thus, the prior art timing verification has problems with timing closure. For example, accurate timing verification is difficult, and much time is necessary for the timing verification.

One aspect of an embodiment is a computer-implemented timing verification method for obtaining delay time for a signal propagated through a signal path and performing timing verification. The method includes storing a table including a wiring resistance variation amount and a wiring capacitance variation amount that are in accordance with a geometry deviation of a wire from a reference geometry, extracting a wiring structure of the signal path from a storage unit, extracting a wiring resistance variation amount and a wiring capacitance variation amount that correspond to the extracted wiring structure from the table, generating an on-chip-variation coefficient from the extracted wiring resistance variation amount and wiring capacitance variation amount, and calculating delay time for the signal propagated through the signal path based on the generated on-chip-variation coefficient.

A further aspect of the embodiment is a timing verification apparatus for obtaining delay time for a signal propagated through a signal path and performing timing verification based on the delay time. The apparatus includes a storage unit for storing a table including a wiring resistance variation amount and a wiring capacitance variation amount that are in accordance with a geometry deviation of a wire from a reference geometry. A processing circuit accesses the storage unit. The processing circuit extracts a wiring structure of the signal path from the storage unit, extracts a wiring resistance variation amount and a wiring capacitance variation amount that correspond to the extracted wiring structure from the table, generates an on-chip-variation coefficient from the extracted wiring resistance variation amount and wiring capacitance variation amount, and calculates delay time for the signal propagated through the signal path based on the generated on-chip-variation coefficient.

Other aspects and advantages of the embodiment will become apparent from the following description, taken in conjunction with the accompanying drawings, illustrating by way of example the principles of the invention.

BRIEF DESCRIPTION OF THE DRAWINGS

The embodiment, together with objects and advantages thereof, may best be understood by reference to the following description of the presently preferred embodiments together with the accompanying drawings in which:

FIGS. 6 and 7 are diagrams showing the wiring structure of a one-signal path;

FIGS. 8(a) and 8(b) are diagrams showing the wiring structure of a unit local zone of the one-signal path;

FIG. 9(a) is a table showing one example of a table including wiring resistance variation amounts that change in accordance with the wiring density, and FIG. 9(b) is a table showing one example of a table including wiring capacitance variation amounts that change in accordance with the wiring density; and FIG. 10(a) is a perspective diagram of a via, and FIG. 10(b) is a table showing a table including via wiring resistance variations that change in accordance with the position of each via.

DETAILED DESCRIPTION OF THE PREFERRED EMBODIMENTS

A preferred embodiment of the present invention will now be described with reference to FIGS. 1 to 10.

Figure 2:
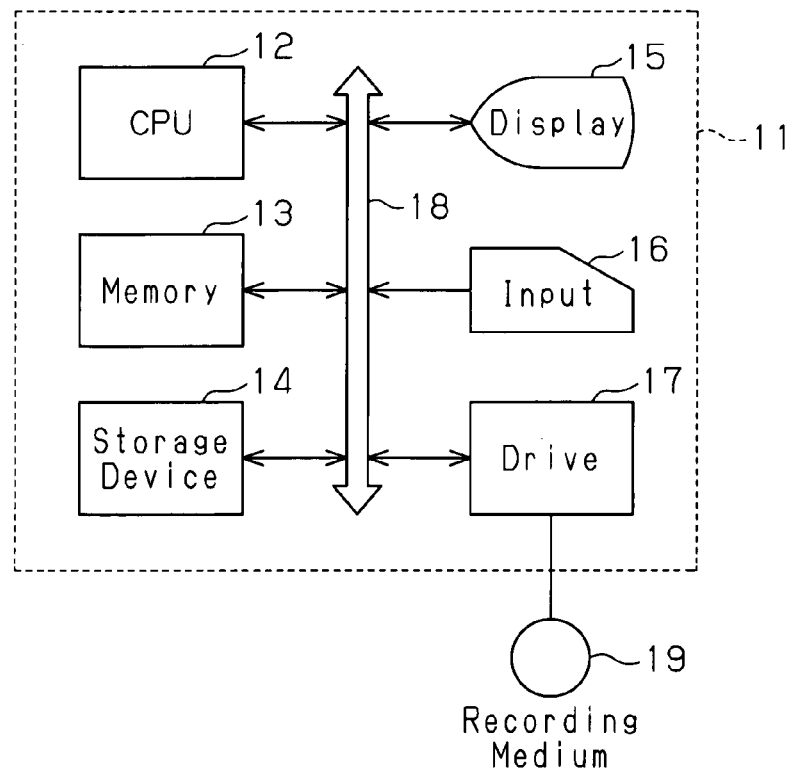
FIG. 2 is a schematic diagram showing the structure of a timing verification apparatus according to the preferred embodiment.

As shown in FIG. 2, a timing verification apparatus 11, which is formed by a typical computer aided design (CAD) apparatus, includes a central processing unit (CPU) 12, a memory 13, a storage unit 14, a display unit 15, an input unit 16, and a drive unit 17, which are connected to one another by a bus 18.

The CPU 12 executes programs using the memory 13 and performs timing verification. The memory 13 stores programs and data necessary to implement a timing verification function. The memory 13 may include a cache memory, a system memory, and a display memory (not shown).

The display unit 15 displays a circuit layout, a parameter input screen, and the like. Examples of the display unit 15 include a cathode-ray tube (CRT), a liquid crystal display (LCD), and a plasma display panel (PDP), none of which are shown in the drawings. The input unit 16 is used to input user requests and instructions as well as parameters. Examples of the input unit 16 include a keyboard and a mouse (not shown).

The storage unit 14 includes a magnetic disk, an optical disc, and a magneto-optical disk (not shown). The storage unit 14 stores program data (hereafter referred to as the "programs") and data files (hereafter referred to as the "files") 31 to 33 used in a timing verification process shown in FIG. 1. The CPU 12 transfers programs and data stored in files to the memory 13 in response to an instruction provided from the input unit 16 and executes each program when required. The CPU 12 reads files necessary to execute a program from the storage unit 14 and stores files and data generated during execution of the program into the storage unit 14. The storage unit 14 is also used as a database.

A recording medium 19 provides programs that are to be executed by the CPU 12. The drive unit 17 drives the recording medium 19 and accesses the storage content of the recording medium 19. The CPU 12 reads programs from the recording medium 19 via the drive unit 17. Then, the CPU 12 installs the programs in the storage unit 14 and executes the programs stored in the storage unit 14.

The recording medium 19 may be a computer-readable storage medium, such as a memory card, a flexible disk, an optical disc (e.g., a CD-ROM or a DVD-ROM), or a magneto-optical disk (e.g., an MO or an MD), none of which are shown. Alternatively, the recording medium 19 may be a semiconductor memory or an external hard disk unit. The programs stored in the recording medium 19 may be loaded onto the memory 13 as required.

The recording medium 19 may be a medium or a disk unit storing programs uploaded or downloaded with a communication medium. The recording medium 19 may also be a storage unit such as a server unit to which the timing verification apparatus 11 (computer) is connected via a communication medium. In addition to a storage medium storing programs that are directly executable by a computer, the recording medium 19 may be a storage medium storing programs that become executable when installed onto the storage medium or onto another storage medium (e.g., a hard disk) or a storage medium storing encrypted or compressed programs.

Figure 1:
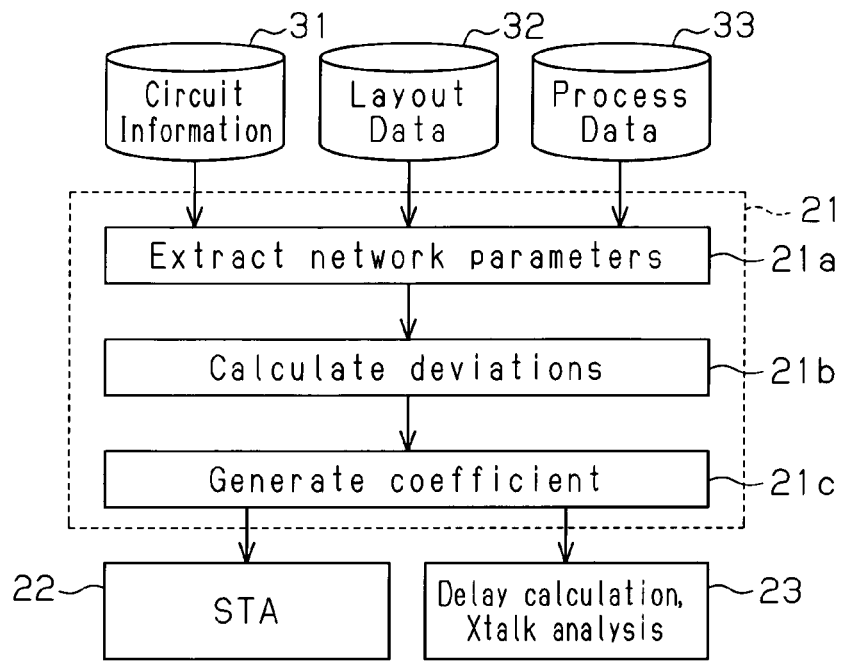
FIG. 1 is a flowchart illustrating a timing verification process according to a preferred embodiment of the present invention.

FIG. 1 is a flowchart illustrating the timing verification process. The timing verification apparatus 11 executes the processing in steps S21 to S23 to perform timing verification of a semiconductor integrated circuit or a large-scale integrated (LSI) circuit. The processing in steps S21 to S23 will now be described.

When an OCV coefficient generation process (step S21) is performed, in the timing verification apparatus 11, a processing circuit, which is, for example, the CPU 12, reads data from the files 31 to 33 and generates or calculates an OCV coefficient based on the read data. The storage unit 14 shown in FIG. 2 stores the files 31 to 33.

The first file 31 stores circuit information (netlist) showing the topology (network) of circuit elements of the LSI circuit, such as transistors and terminals. The second file 32 stores layout data showing the geometries and layout positions of cells, wires, and vias of the LSI circuit. The third file 33 stores process data of the LSI circuit. The process data includes parameters of the wiring resistance variation and the wiring capacitance variation caused by manufacturing processes and the structure of the LSI circuit.

The CPU 12 reads the circuit information from the first file 31 and the layout data from the second file 32 to obtain structure data corresponding to the wiring structure of each network based on the read circuit information and the read layout data (S21a). Based on the structure data, the CPU 12 looks up on (searches) a table stored in the third file 33 for the wiring resistance and the wiring capacitance (variation amounts) corresponding to the wiring structure of each network (S21b). The CPU 12 generates an OCV coefficient based on the obtained wiring resistance and wiring capacitance (S21c).

In an STA (static timing analysis) process performed in step S22, the CPU 12 adds the signal delay time of each circuit element and wire in the signal path. Then, the CPU 12 multiplies the sum by the OCV coefficient generated in step S21 to calculate the propagation delay time of the signal path.

In a delay calculation and crosstalk (Xtalk) analysis process performed in step S23, the CPU 12 calculates the wire delay time of each network using the OCV coefficient generated in step S21 to perform crosstalk analysis. The CPU 12 calculates the wire delay time of each network and the variation amount of the wire delay time of each network based on the OCV coefficient. Based on the generated OCV coefficient and wiring capacitance, the CPU 12 also calculates crosstalk noise added to the wiring and the amount of change in the delay time caused by such crosstalk noise. The CPU 12 compares the calculated delay time, noise amount, and change amount with predetermined allowable ranges to determine the appropriateness of the wiring of each network.

The OCV coefficient generation process will now be described in detail.

The OCV coefficient generation process in S21 includes sub-steps S21a to S21c. In steps S21a to S21c, the CPU 12 generates an OCV coefficient for each network. More specifically, the CPU 12 generates the optimal OCV coefficient for each network based on the wiring structure of each network. The wiring structure of each network includes logic connection information, physical connection information, and the geometries and dimensions of wires and vias in each network.

In the first process or in a parameter extraction process (step S21a), the CPU 12 reads the circuit information (netlist) stored in the first file 31 and the layout data stored in the second file 32 in the storage unit 14 shown in FIG. 2. From the read circuit information, the CPU 12 extracts the geometries of wires and vias that form signal transmission paths of each network. Each signal transmission path may be formed by a plurality of wires, which are formed in a plurality of wiring layers, and a plurality of vias, which electrically couple wires formed in different wiring layers. The CPU 12 extracts the geometries of all the wires and all the vias that form each path in each network from the layout data.

The CPU 12 divides each of the wires included in the wiring layers into a plurality of segments. Each segment has the same reference wiring length. For example, the path shown in FIG. 6 extends from a signal transmission start Ss to a signal transmission end Se and includes a plurality of wires L1 to L6 formed in a plurality of wiring layers (Metal2 to Metal4) and a plurality of vias V1 to V7 electrically coupling wires in different layers. The CPU 12 divides each of the wires L1, L3, L4, and L5 into a plurality of segments. Each of the wires L1 to L6 is a metal wire, which is made of, for example, aluminum. Such metal wires extend in each of the wiring layers Metal2, Metal3, and Metal4. In the parameter extraction process S21a, the CPU 12 reconstructs each path with the segments, which have been formed as a result of the dividing, and the vias.

In the second process or a variation calculation process (step S21b), the CPU 12 calculates the wiring resistance variation and the wiring capacitance variation (RC variation) corresponding to each of the segments reconstructed in step S21a.

In detail, the CPU 12 first calculates the wiring resistance variation amount and the wiring capacitance variation amount for each segment taking into consideration the wiring density of each segment.

The wiring resistance of one wire and the wiring capacitance of a parasitic element (parasitic capacitance) formed between the wire and another wire may be determined, for example, by the height and width of the wire and the thickness of an interlayer insulator adjacent to the wire, which also affect the wiring resistance variation and the wiring capacitance variation. As shown in FIG. 8(a), a segment Sg having a unit length L has a wiring width W and a wiring height H. The wiring resistance of the segment Sg is determined by the cross-sectional area of the segment Sg (W*H). The lower surface of the segment Sg has an area of W*L. The side surface of the segment Sg has an area of H*L. The geometry or dimensions (W, H, and L dimensions) of the segment Sg may be referred to as the reference geometry. The wiring capacitance of the segment Sg includes a wiring capacitance determined by a parasitic element (capacitor) formed between the segment Sg and a wire formed in a wiring layer immediately below the segment Sg and also includes a wiring capacitance determined by a parasitic element (capacitor) formed between the segment Sg and a wire formed at a position facing a side surface of the segment Sg.

The geometry of the segment Sg may have variations ($\Delta W$, $\Delta H$, and $\Delta L$) that are caused by the structure of the LSI circuit. One cause for such geometry variations of the segment Sg shown in FIG. 8(b) is the wiring density of a unit space (also referred to as a local zone) that includes the segment Sg. When the LSI circuit has a multi-layer structure, the geometry of each metal wire may vary in accordance with the structure of underlying wiring layers. In the example shown in FIGS. 6 and 7, the metal wiring layer Metal2 is formed on an interlayer insulator that covers the metal wiring layer Metal1. The upper surface of the interlayer insulator on which the segment Sg is formed may not be flat and may be shaped in correspondence with the wire density of the layers below the segments Sg. The height of the segment Sg entirely or partially formed on an inclined surface would be different from the height H of the segment Sg formed on a flat surface. The degree by which the height H of the segment Sg formed on the inclined surface differs from the height H of the segment Sg formed on the flat surface is in accordance with the inclination of the inclined surface (H−$\Delta H$, where $\Delta H$ indicates the height that decreases depending on the surface inclination). Thus, the segment Sg formed on the inclined surface would have a substantial cross-sectional area that is smaller than that of the segment Sg formed on the flat surface. In other words, the wiring resistance variation of the segment is in accordance with the wiring density of the wiring layer formed below the segment.

Another example will be described using, for example, a segment formed on the metal wiring layer Metal2 and a segment formed on the third metal wiring layer Metal3. The upper surface of an interlayer insulator on which the segment of the metal wiring layer Metal3 is formed is affected by the wires of the first and second wiring layers. Thus, even when the layers (first and second layers) below the metal wiring layers Metal1 and Metal3 have the same wiring density, the shape of the upper surface of the interlayer insulator on which the segment of the metal wiring layer Metal3 is formed differs from the shape of the upper layer of an interlayer insulator on which the segment of the metal wiring layer Metal2 is formed. As a result, the wiring resistance variation of the segment formed on the metal wiring layer Metal2 and the wiring resistance variation of the segment formed on the third metal wiring layer Metal3 differ from each other.

Further, the metal wires formed in one wiring layer may have different characteristics. The characteristics of each metal wire in the same wiring layer may vary depending on another metal wire formed in the same wiring layer. In the same wiring layer, the wire etching rate of a region having a high wiring density differs from the wire etching rate of a region having a low wiring density. As a result, the wiring width of the wiring layer region having a high wiring density differs from the wiring width of the wiring layer region having a low wiring density. In other words, the wiring resistance of each segment varies even within the same wiring layer in accordance with the wiring density at the position of each segment.

For the reasons described above, the timing verification apparatus 11 calculates the resistance variation amount for each segment of a layer. Then, the timing verification apparatus 11 uses the wiring densities of that layer and the underlying layers as index parameters to generate a first table 33a (FIG. 9(a)) indicating the segment resistance variation amount. The first table 33a is stored in the third file 33 shown in FIG. 1. The resistance variation amounts ($\sigma_{R\_11}$ etc.) shown in the first table 33a are expressed in ohms (Ω). Each segment is located in a local zone, which is defined by layers located at the same portion of a wafer. The CPU 12 calculates the number of segments in one layer of the local zone as the wiring density of that layer. The CPU 12 also calculates the number of segments in the immediately underlying layer of the local zone. For each segment, the CPU 12 then extracts the wiring resistance variation amount corresponding to the calculated wiring densities of the two layers from the first table 33a (first extraction unit).

The wiring capacitance of the segment Sg varies in accordance with the wiring densities of the corresponding layer and underlying layer (and the areas of the wires facing toward the lower and side surfaces of the segment Sg). For this reason, the timing verification apparatus 11 calculates the capacitance variation amount for each segment in a layer. Then, the timing verification apparatus 11 uses the wiring densities of that layer and the underlying layers as index parameters to generate a second table 33b (FIG. 9(b)) indicating the segment capacitance variation amount. The second table 33b is stored in the third file 33 shown in FIG. 1. The variation amounts ($\sigma_{c\_11}$) shown in the second table 33b are expressed in Farad (F). Each segment is located in a local zone, which is defined by layers located at the same portion of a wafer. The CPU 12 calculates the number of segments in one layer of the local zone as the wiring density of that layer. The CPU 12 also calculates the number of segments in the immediately underlying layer of the local zone. For each segment, the CPU 12 then extracts the wiring capacitance corresponding to the calculated wiring densities of the two layers from the second table 33b (first extraction unit).

For the same reasons as described above, the timing verification apparatus 11 may take into consideration the wiring capacitance that is determined by a parasitic element (capacitor) formed between the segment Sg and wires of a wiring layer formed immediately above the segment Sg. In this case, the two index parameters in each of the first and second tables 33a and 33b stored in the third file 33 are changed to three index parameters, namely, the wiring density of the layer including the segment, the wiring density of the immediately underlying layer, and the wiring density of the immediately overlying layer.

Variations in the wiring resistance of a via coupling two adjacent wires formed in different wiring layers will now be discussed. As shown in FIG. 10(a), a via V may be shaped as a quadrangular prism. The cross-sectional area of the via V changes in accordance with the location where the via V is formed. This means that the wiring resistance variation of the via depends on the formation position of the via. Accordingly, the wiring resistance variation of a via (e.g., V2) that couples wires of the wiring layer Metal1 and wiring layer Metal2 differs from the wiring resistance variation of a via (e.g., V3) that couples a wire of the wiring layer Metal2 and a wire of the wiring layer Metal3. As shown in FIG. 10(b), a third table 33c is generated in advance for associating the via wiring resistance variation amount with the via formation position (wiring layers). The third table 33c is stored in the third file 33 shown in FIG. 1. For each via, the CPU 12 extracts the wiring resistance variation amount that corresponds to the formation position of the via (second extraction unit).

The CPU 12 extracts the wiring resistance variation amount and wiring capacitance variation amount for each segment and the wiring resistance variation amounts for each via. Then, the CPU 12 then calculates variations in correlation values of the wiring resistance and wiring capacitance for each segment.

Through the above extraction process, the wiring resistance variation amount and the wiring capacitance variation amount for each segment have been calculated. Standard values for the wiring resistance and wiring capacitance of each segment is determined from the geometry of each segment. Accordingly, based on the calculated variation amounts and the standard values, maximum and minimum values for the wiring resistance of each segment and maximum and minimum values for the wiring capacitance of each segment are calculated. For each segment, the CPU 12 then calculates a variation amount that takes into consideration the correlation between the wiring resistance and wiring capacitance based on the calculated values.

Figure 3:
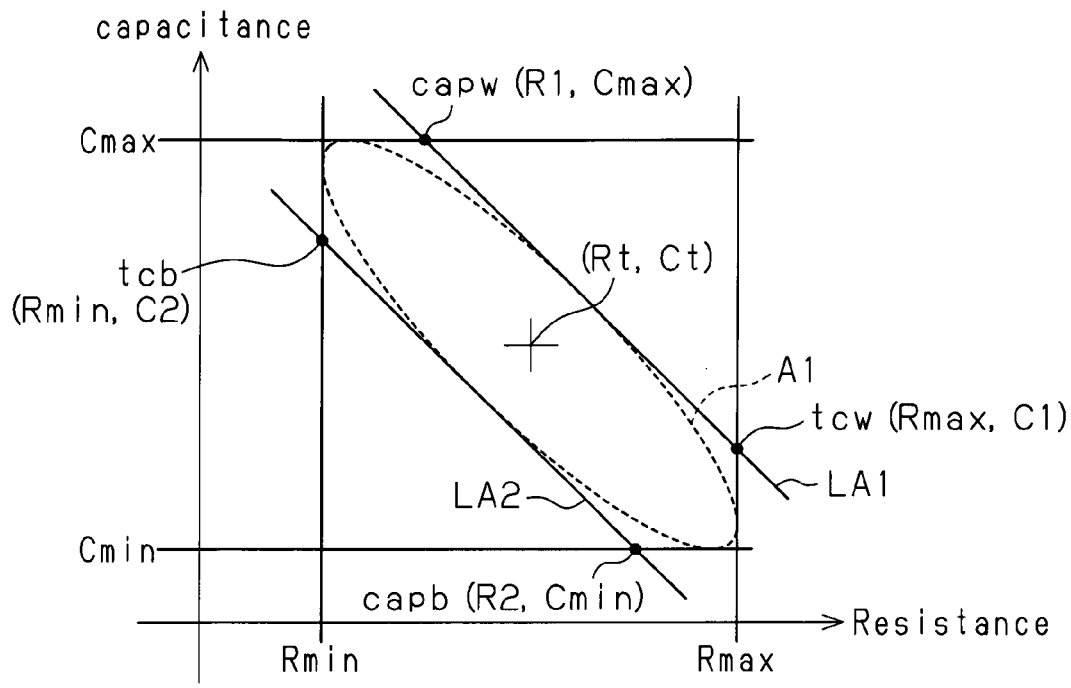
FIG. 3 is a diagram describing variations of the wiring resistance and wiring capacitance.

An actual segment may have the wiring resistance and the wiring capacitance of which values are distributed within an oval range A1 indicated by the broken line in FIG. 3. A central point Typ (Rt, Ct) of the oval range A1 corresponds to the values of the wiring resistance wiring capacitance that are set based on the wiring geometry of the layout design. The segment has the wiring resistance of which values are distributed in a range from a minimum value Rmin to a maximum value Rmax of the wiring resistance. The segment has the wiring capacitance of which values are distributed in a range from a minimum value Cmin to a maximum value Cmax of the wiring capacitance. The wiring resistance and the wiring capacitance have a correlation in which the value of the wiring resistance is substantially inversely proportional to the value of the wiring capacitance. In other words, the wiring capacitance of the segment decreases as the wiring resistance of the segment increases. It is apparent from this correlation that the timing verification of the prior art using the combination of the wiring resistance maximum value Rmax and wiring capacitance maximum value Cmax or the combination of the wiring resistance minimum value Rmin and wiring capacitance minimum value Cmin is performed under a pessimistic-case condition with excessive margins.

Figure 4:
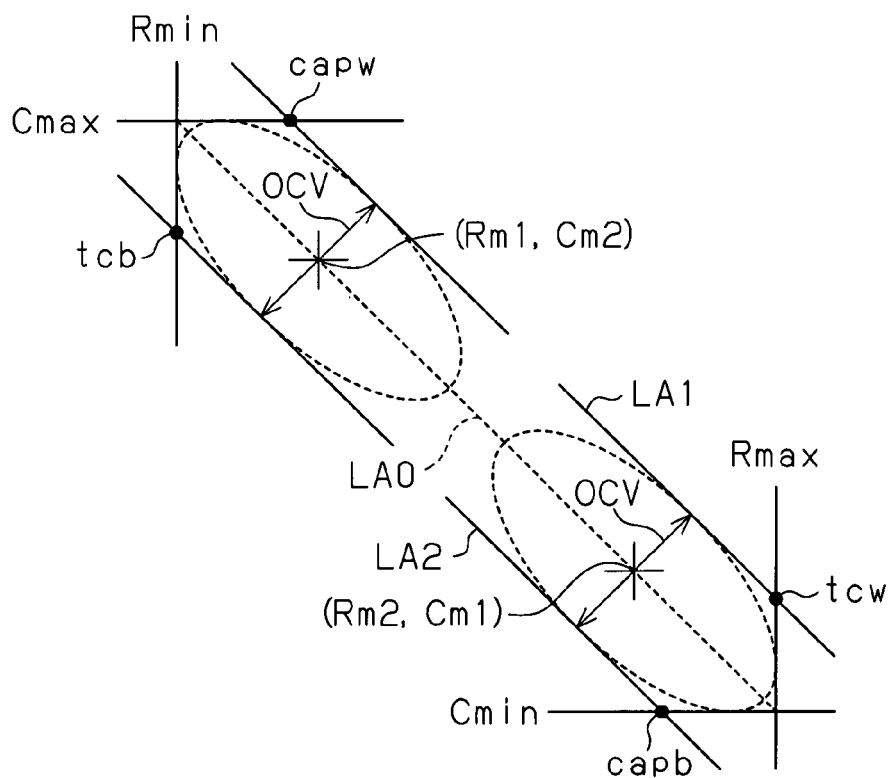
FIG. 4 is a distribution chart showing characteristic variations.

The timing verification apparatus 11 sets the wiring resistance and wiring capacitance values based on the above correlation as corner values, which define the delay time calculation range. As shown in FIG. 3, two characteristic lines LA1 and LA2, which are downward sloping straight lines, are drawn to approximate the oval range A1. In the example of FIG. 4, characteristic lines LA1 and LA2, which are parallel to a straight line LA0 extending through point (Rmax, Cmin) and point (Rmin, Cmax) as shown in FIG. 3, are tangent to the variation range A1. The points at which the characteristic lines LA1 and LA2 intersect with the contour of a rectangular area defined by the values Rmax, Rmin, Cmax, and Cmin are set as corner values. The corner values in FIG. 3, namely, the four intersection points capw, tcw, capb, and tcb, are expressed as (R1, Cmax), (Rmax, C1), (R2, Cmin), and (Rmin, C2). In other words, the corner values are set by combining the maximum value Rmax and the minimum value Rmin of the wiring resistance and the maximum value Cmax and the minimum value Cmin of the wiring capacitance with the values (R1, R2, C1, and C2) determined by the wiring resistance variation distribution and the wiring capacitance variation distribution. The use of such corner values enables timing verification to accurately correspond to the geometries of the actual wires.

The value obtained by multiplying the wiring resistance (R) and the wiring capacitance (C) (hereafter referred to as the "RC product") correlates with the delay time. More specifically, the delay time becomes longer as the RC product becomes greater. Thus, when the corner values capb and tcb are used, the timing verification is performed in the best-case condition. When the corner values capw and tcw are used, the timing verification is performed in the worst-case condition.

Other examples of corner values will now be described.

The variation range A1 of FIG. 3 shows the variation distribution that takes into consideration all possible variations that may occur in the manufacturing processes of the LSI circuit. This distribution is focused on the wiring resistance and represents a normal distribution PV shown in FIG. 5. However, on-chip variation distributions CVB and CVW shown in FIG. 5 may be used as modeled corners to calculate the delay time in timing verification. For the wiring resistance, the on-chip variation distributions include the distribution CVW, of which the center is a value Rm1 that is close to the maximum value Rmax of the wiring resistance, and the distribution CVB, of which center is a value Rm2 that is close to the minimum value Rmin of the wiring resistance. As shown in FIG. 4, the values Rm1 and Rm2 of the wiring resistance correspond to the values Cm2 and Cm1 of the wiring capacitance. In the same manner, the centers of the on-chip variation distributions for the wiring capacitance are the values Cm1 and Cm2. The delay time varies in accordance with the RC product. Thus, when the timing verification takes into consideration the wiring resistance and the wiring capacitance, the timing verification must be performed using the distribution center (Rm1, Cm2) of the wiring resistance axis, the distribution center (Rm2, Cm1) of the wiring capacitance, and the RC product variation (width indicated by arrows in FIG. 4) including these distribution centers. The use of the distribution centers and the RC product variation as the delay distribution for each segment enables the wiring resistance variation distribution and the wiring capacitance variation distribution to be taken into consideration for the timing verification.

In the third process, that is, in the coefficient generation process (step S21c), the CPU 12 generates an OCV coefficient based on the variation amounts. The OCV coefficient takes into consideration the wiring resistance and the wiring capacitance of each wire (segment).

After calculating the delay variation amounts for each of the wires (segments) and each of the vias that form the signal transmission paths in each network, the CPU 12 calculates a delay variation amount for each network. The delay variation amount may be calculated through a convolution integral method. More specifically, the CPU 12 convolves the delay variation amounts of each of the segments and each of the vias that form each path. Then, the CPU 12 calculates the delay variation amount occurring from the signal transmission start to the signal transmission end (Se in FIG. 6) of each path. The CPU 12 generates the OCV coefficient of the wire delay based on the calculated delay variation amount. The OCV coefficient is generated, for example, using the modeled corners (corner values) in the manner described below.

OCV coefficient=(wire delay value taking into consideration delay variation with respect to corner)/(corner wire delay value)

Figure 5:
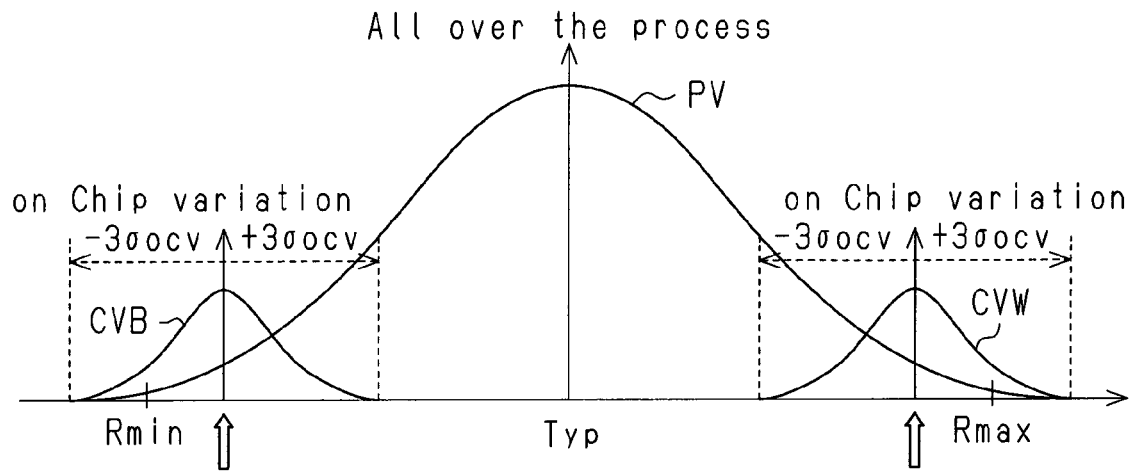
FIG. 5 is a diagram describing OCV coefficients.
Figure 6:
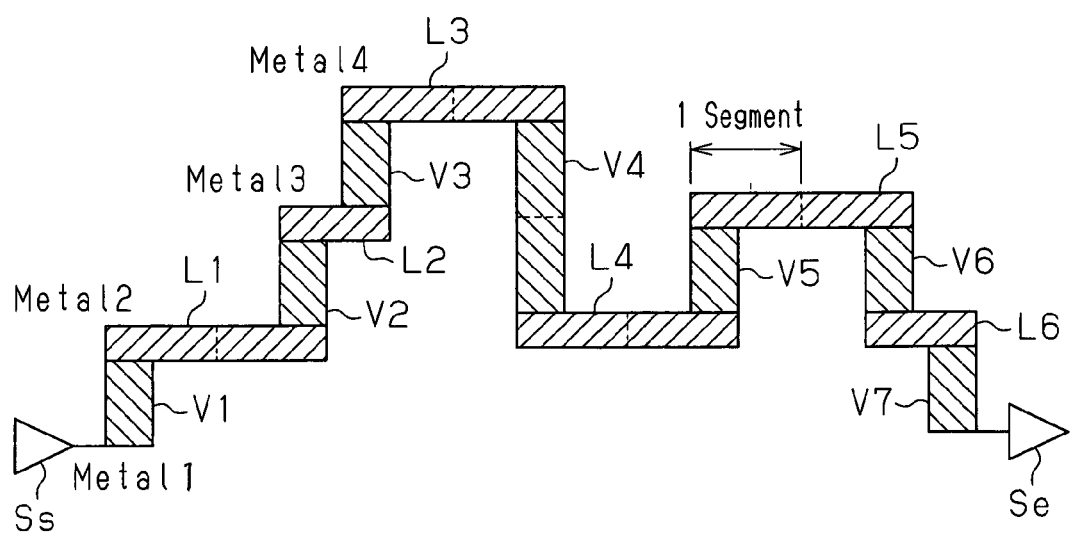

The delay variation amount of each path calculated through the convolution corresponds to the delay variation characteristic of each segment, that is, to the RC product. Thus, the distribution center value is used as the corner wire delay value. A statistical value for the distribution, which is $3\sigma$, is used as the wire delay value that takes into consideration variations. As shown in FIG. 5, the value $3\sigma$ consists of a value b1 ($=-3\sigma$) that indicates a smaller delay time with respect to the distribution center value and a value b2 ($=+3\sigma$) that indicates a greater delay time with respect to the distribution center value. When the center value is b0, OCV coefficients are generated in the following manner.

coefficient (1)=b1/b0
coefficient (2)=b1/b0

As another example, OCV coefficients may also be generated using the values b1 and b2 as follows.

coefficient (1)=b1/b2
coefficient (2)=b2/b1

The preferred embodiment has the advantages described below.

(1) The tables including the wiring resistance variation and the wiring capacitance variation corresponding to the deviation of the geometry of each wire from the reference geometry (Sg) are stored in the data file 33. The data file 33 functions as the first storage unit. The CPU 12 extracts the wiring structure of one-signal path. The CPU 12 extracts the wiring resistance variation and the wiring capacitance variation corresponding to the extracted wiring structure from the tables. The CPU 12 then generates an OCV coefficient based on the extracted wiring resistance variation and the extracted wiring capacitance variation (S21). The CPU 12 finally calculates the delay time of a signal propagated through the signal path based on the generated OCV coefficient.

With this structure, the timing verification apparatus 11 first obtains the wiring resistance variation and the wiring capacitance variation corresponding to the wiring structure of the signal path. Then, the timing verification apparatus 11 generates the OCV coefficient used to calculate the delay based on the obtained wiring resistance and wiring capacitance variations. The timing verification apparatus 11 performs highly accurate timing verification that corresponds to the wiring structure of the semiconductor integrated circuit.

(2) The timing verification apparatus 11 includes the first file 31 and the second file 32. The first file 31 functions as the second storage unit for storing the circuit information of the semiconductor integrated circuit. The second file 32 functions as the third storage unit for storing the layout data of the semiconductor integrated circuit. The CPU 12 extracts, from the files 31 and 31, the wiring structures of each signal path included in each network to generate the OCV coefficient corresponding to each network. The timing verification apparatus 11 generates the OCV coefficient corresponding to each network of the semiconductor integrated circuit based on the design data of the semiconductor integrated circuit. The timing verification apparatus 11 generates one optimal OCV coefficient for each network instead of generating one OCV coefficient for the entire semiconductor integrated circuit. This improves the accuracy of the timing verification.

(3) The CPU 12 divides the wires forming each signal path into segments Sg having the reference geometry. The number of wiring layers that extend on the signal path, the number of segments that form the signal path, and the number of vias that couple the wiring layers are counted. For each segment, the number of wires included in the corresponding local zone is set as the wiring density of the segment. The wiring resistance variation and the wiring capacitance variation corresponding to the wiring density are then extracted from the tables. The timing verification apparatus 11 the highly accurate wiring resistance variation and wiring capacitance variation corresponding to the wiring structure of each of all the signal paths included in each network.

(4) The first storage unit (data file 33) stores the third table 33c including via wiring resistance variation amounts that differ in accordance with the wiring layers to which the vias are coupled. The wiring resistance variation corresponding to each via is extracted from the table 33c based on the wiring structure of each signal path. The timing verification apparatus 11 with this structure obtains the highly accurate wiring resistance variation that corresponds to each of the vias in the signal paths of each network.

(5) The delay value variation of each network is calculated based on the wiring resistance variation and the wiring capacitance variation of each of the segments of the network and the wiring resistance variation of each of the vias of the network. The OCV coefficient for each network is generated based on the calculated delay value variation of each network. The timing verification apparatus 11 accurately generates the OCV coefficient that corresponds to the wiring structure of each network.

(6) The CPU 12 calculates the delay value variation amount of each network based on the wiring resistance variation and the wiring capacitance variation of each of the segments of the network and the wiring resistance variation of each of the vias of the network. The CPU 12 sets the corner values (capb, capw, tcb, and tcaw) for defining the delay time calculation range for each network based on the delay value variation calculated for each network. The CPU 12 then generates the OCV coefficient for each network based on the corner values (capb, capw, tcb, and tcaw). According to this arrangement, the OCV coefficient that corresponds to the wiring structure of each network is accurately obtained.

(7) As apparent from the above advantages (3) to (5), systematic variation elements dependent on the wiring geometry and random variation elements independent of the wiring geometry are separately taken into consideration. This improve the accuracy of the variation coefficients.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A computer-implemented timing verification method for obtaining a delay time for a signal propagated through a signal path and performing timing verification, the method comprising:
    storing, in a storage unit, a table including a wiring resistance variation amount and a wiring capacitance variation amount that are in accordance with a geometry deviation of a wire from a reference geometry;
    extracting, by a processing circuit, a wiring structure of the signal path from the storage unit;
    extracting, by the processing circuit, a wiring resistance variation amount and a wiring capacitance variation amount that correspond to the extracted wiring structure from the table;
    generating, by the processing circuit, an on-chip-variation coefficient from the extracted wiring resistance variation amount and the wiring capacitance variation amount;
    calculating, by the processing circuit, the delay time for the signal propagated through the signal path based on the generated on-chip-variation coefficient;
    dividing, by the processing circuit, a wire that forms the signal path into segments having the reference geometry; and
    setting, by the processing circuit, for each segment, the number of segments in a local zone that includes said segment as a wiring density of the location at which the segment is formed;
    wherein the table includes a first table containing wiring resistance variation amounts respectively corresponding to wiring densities at locations where the segments are formed and a second table containing wiring capacitance variation amounts respectively corresponding to wiring densities at locations where the segments are formed, with the wiring resistance variation amount and the wiring capacitance variation amount being extracted from the first and second tables.

2. The timing verification method according to claim 1, wherein:
    the signal path is one of a plurality of signal paths included in one of a plurality of networks of a semiconductor integrated circuit;
    the wiring structure includes circuit information for the semiconductor integrated circuit and layout data for the semiconductor integrated circuit that are stored in the storage unit;
    the wiring structure of the signal path is extracted for each network of the semiconductor integrated circuit; and
    the on-chip-variation coefficient is generated for each network of the semiconductor integrated circuit.

3. The timing variation method according to claim 1, wherein the signal path extends over a plurality of wiring layers, and the table stored in the storage unit further includes a third table containing wiring resistance variation amounts respectively corresponding to locations of vias that connect the wiring layers, the method further comprising:
    extracting, by the processing circuit, a wiring resistance variation amount corresponding to each via from the third table based on the wiring structure of the signal path.

4. The timing verification method according to claim 3, further comprising:
    calculating, by the processing circuit, a delay value variation amount for each network of the semiconductor integrated circuit based on the extracted wiring resistance variation amount of each segment, the extracted wiring capacitance variation amount of each segment, and the extracted wiring resistance variation amount of each via; and
    generating, by the processing circuit, the on-chip-variation coefficient for each network based on the calculated delay value variation amount.

5. The timing verification method according to claim 3, further comprising:
    calculating, by the processing circuit, a delay value variation amount for each network based on the extracted wiring resistance variation amount of each segment, the extracted wiring capacitance variation amount of each segment, and the extracted wiring resistance variation amount of each via;
    setting, by the processing circuit, corner values defining a delay time calculation range for each network based on the calculated delay value variation amount; and
    generating, by the processing circuit, the on-chip-variation coefficient for each network based on the set corner values.

6. A timing verification apparatus for obtaining a delay time for a signal propagated through a signal path and performing timing verification based on the delay time, the apparatus comprising:
- a storage unit for storing a table including a wiring resistance variation amount and a wiring capacitance variation amount that are in accordance with a geometry deviation of a wire from a reference geometry; and
- a processing circuit for accessing the storage unit, the processing circuit:
- extracting a wiring structure of the signal path from the storage unit;
- extracting a wiring resistance variation amount and a wiring capacitance variation amount that correspond to the extracted wiring structure from the table;
- generating an on-chip-variation coefficient from the extracted wiring resistance variation amount and the wiring capacitance variation amount; and
- calculating the delay time for the signal propagated through the signal path based on the generated on-chip-variation coefficient, wherein the processing circuit:
- divides a wire that forms the signal path into segments having the reference geometry; and
- sets, for each segment, the number of segments in a local zone that includes said segment as a wiring density of the location at which the segment is formed;
- wherein the table includes a first table containing wiring resistance variation amounts respectively corresponding to wiring densities at locations where the segments are formed and a second table containing wiring capacitance variation amounts respectively corresponding to wiring densities at locations where the segments are formed, with the wiring resistance variation amount and the wiring capacitance variation amount being extracted from the first and second tables.

7. The timing verification apparatus according to claim 6, further comprising:
- a second storage unit for storing circuit information of a semiconductor integrated circuit; and
- a third storage unit for storing layout data for the semiconductor integrated circuit,
- wherein the signal path is one of a plurality of signal paths included in one of a plurality of networks of the semiconductor integrated circuit, and the processing circuit extracts the wiring structure of the signal path for each network of the semiconductor integrated circuit and generates the on-chip-variation coefficient for each network.

* * * * *